US006838717B1

United States Patent
Yen et al.

(10) Patent No.: US 6,838,717 B1
(45) Date of Patent: Jan. 4, 2005

(54) STACKED STRUCTURE FOR PARALLEL CAPACITORS AND METHOD OF FABRICATION

(75) Inventors: Allen Yen, Orlando, FL (US); Frank Yauchee Hui, Orlando, FL (US); Yifeng Winston Yan, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 336 days.

(21) Appl. No.: 09/653,295

(22) Filed: Aug. 31, 2000

(51) Int. Cl.[7] .................. H01L 27/108; H01L 29/76; H01L 29/94; H01L 31/119
(52) U.S. Cl. ....................... 257/295; 257/532
(58) Field of Search .................. 257/295–310, 257/530–535, 536; 438/240–254, 393–398; 365/145

(56) References Cited

U.S. PATENT DOCUMENTS

| | | | | |
|---|---|---|---|---|
| 3,962,713 A | * | 6/1976 | Kendall et al. ............. 257/532 |
| 5,481,490 A | * | 1/1996 | Watanabe et al. ........... 365/145 |
| 5,643,804 A | * | 7/1997 | Arai et al. .................. 438/795 |
| 5,736,448 A | * | 4/1998 | Saia et al. .................. 438/393 |
| 6,180,976 B1 | * | 1/2001 | Roy ............................ 257/306 |

* cited by examiner

Primary Examiner—Cuong Nguyen
(74) Attorney, Agent, or Firm—Ferdinand M. Romano

(57) ABSTRACT

A monolithic integrated circuit including a capacitor structure. In one embodiment the integrated circuit includes at least first and second levels of interconnect conductor for connection to a semiconductor layer and a stack of alternating conductive and insulative layers formed in vertical alignment with respect to an underlying plane. The stack is formed between the first and second levels of conductor. Preferably the stack includes a first conductive layer, a first insulator layer formed over the first conductive layer, a second conductive layer formed over the first insulative layer, a second insulator layer formed over the second conductive layer, and a third conductive layer formed over the second insulative layer, with the first and third conductive layers commonly connected.

6 Claims, 8 Drawing Sheets

STACKED STRUCTURE FOR PARALLEL CAPACITORS AND METHOD OF FABRICATION

FIELD OF THE INVENTION

The present invention relates to semiconductor devices and, more specifically, to devices having capacitor structures formed in metallization levels over a semiconductor layer.

BACKGROUND OF THE INVENTION

As the level of semiconductor process integration has progressed, advances in the technology have been largely focused on reducing feature sizes and layout geometry of active devices as well as increasing the density of metallization. However, in many instances, reductions in the area requirements for passive devices have not kept pace with reduced feature sizes of active devices and metallization. For example, the layout area required for resistors is largely determined by the sheet resistance. The physical size of a capacitor network is limited by several factors, including the required area of the capacitor plates as well as the thickness of the intervening dielectric. That is, as dielectric thickness decreases the capacitance increases such that the capacitor becomes less area consuming. Generally, reduction in layout area for resistor and capacitor structures has been largely considered a function of material selection. There is a need to provide additional methods and designs so that further reductions in area requirements of passive structures will not depend solely on development of new materials. In particular, further reduction in area requirements for capacitors will enable further improvement in the level of integration for both digital and analog circuitry. Prior efforts to increase capacitance without increasing area consumed over a semiconductor region were effected by forming multiple capacitors on separate metal levels and connecting these in parallel.

In the past, in order to provide increased capacitance to meet circuit requirements, capacitors formed on separate metal levels have been wired in parallel circuitry. Another means of achieving high capacitance has been reduction in the thickness of the dielectric layer between the capacitor plates.

SUMMARY OF THE INVENTION

According to illustrated embodiments of the invention a semiconductor device includes first and second levels of interconnect conductor for connection to a semiconductor layer. A stack of alternating conductive and insulative layers is formed in vertical alignment with respect to an underlying plane. The stack, formed between the first and second levels of conductor, includes a first conductive layer, a first insulator layer formed over the first conductive layer, a second conductive layer formed over the first insulative layer, a second insulator layer formed over the second conductive layer, and a third conductive layer formed over the second insulative layer. The first and third conductive layers are commonly connected.

According to an associated method for making a semiconductor device with a capacitor structure one embodiment includes forming a first conductive runner on a first insulative layer and forming a second conductive runner above the first conductive runner. A stack of alternating conductor and dielectric layers is formed between the first conductive runner and the second conductive runner and an opening is etched in an upper-most of the conductive layers. The opening is extended through an adjoining dielectric layer to a first underlying conductor layer.

BRIEF DESCRIPTION OF THE DRAWINGS

Numerous advantages of the invention will be apparent when the following detailed description of the invention in conjunction with the accompanying drawings in which.

Like numbers refer to like elements throughout the drawings while it should be noted that various features illustrated in the figures are not drawn to scale with one another.

DETAILED DESCRIPTION

Figure 1:
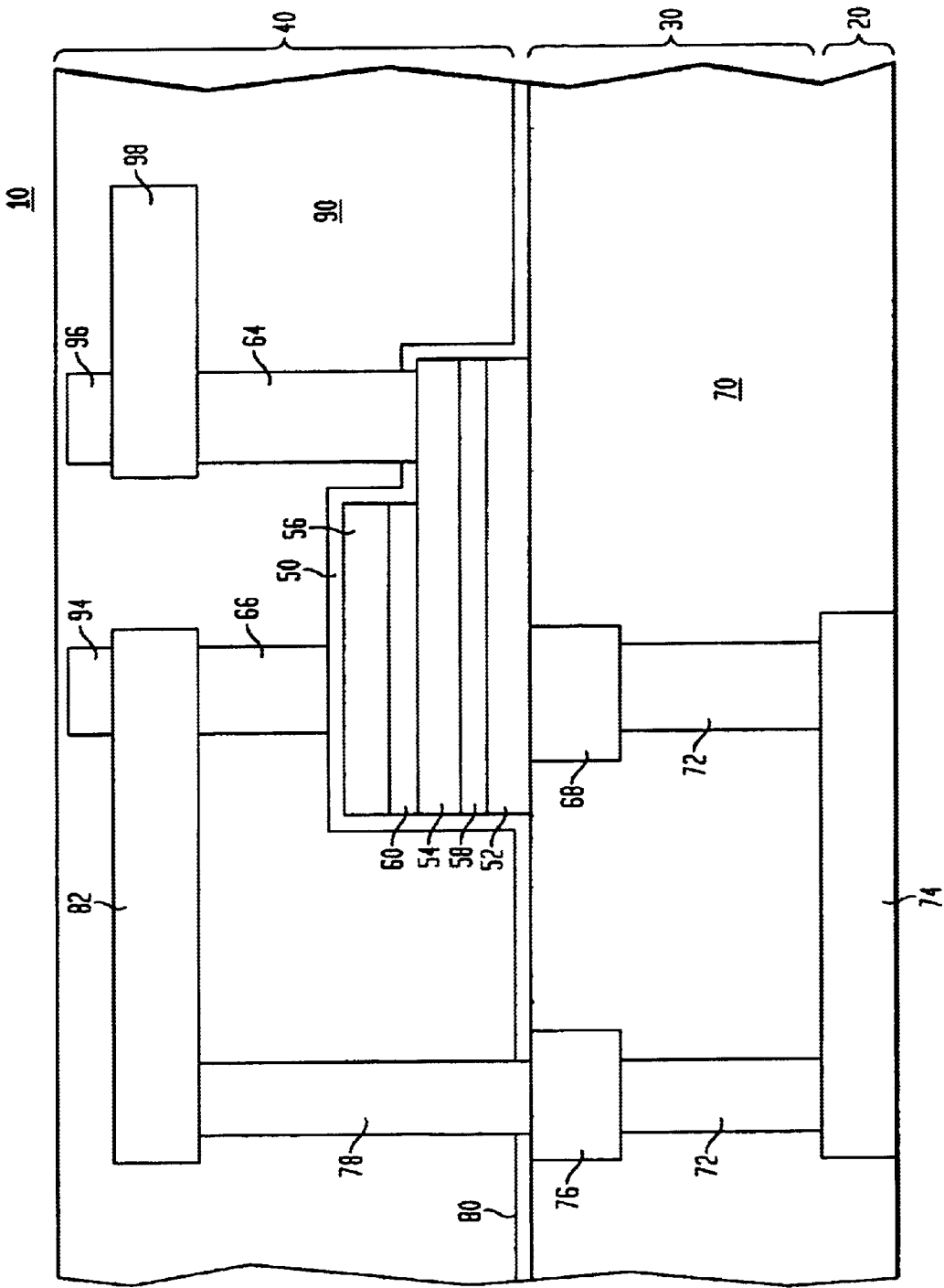
FIG. 1 illustrates in partial cross-sectional view one embodiment of the invention.

With reference to the view of FIG. 1, the invention is described with respect to formation and connection of an exemplary capacitor structure formed in three levels of interconnect metallization. A portion of an integrated circuit structure 10 is shown in partial cross section to provide details of the invention in a metallization structure. The metallization structure is formed over a semiconductor layer (not illustrated) which typically will have a plurality of transistors in the surface thereof. In this exemplary embodiment, several upper levels of metal interconnect, such as Al or Cu runners, are formed over the semiconductor layer according to a dual Damascene fabrication process. Specifically, a portion of the integrated circuit structure 10 is shown in FIG. 1 to include three sequentially formed levels of metallization 20, 30 and 40. One or more additional levels of metallization may be formed below level 20 and one or more additional levels of metallization may be formed above level 40. Generally, the metal runners in each level are formed along a plane such as illustrated by line 42 along level 20. For purposes of illustrating the invention a capacitor structure 50 is electrically connected to conductors in the illustrated levels of metallization. The capacitor structure 50 includes alternating layers of conductor and insulator formed in vertical alignment with respect to an underlying plane such as plane 42 or the plane of the surface on which the structure is formed. The structure 50 is wired to provide two capacitors in parallel. Three conductor layers 52, 54, and 56 are isolated from one another by two intervening dielectric layers. One dielectric layer 58 is formed between conductors 52 and 54 and the other dielectric layer 60 is formed between conductor layers 54 and 56.

In the illustrated structure 50 the conductor layer 54 is a capacitor plate common to a first capacitor formed with layers 52 and 58 and a second capacitor formed with layers 56 and 60. A via portion 64 of metallization level 40 contacts the conductor layer 54 to provide a common terminal for both capacitors. Another via portion 66 of metallization level 40 makes connection with the conductor layer 56 to provide a second terminal for the capacitor formed by layers 54, 56 and 60. A conductor runner portion 68 of metallization level 30 provides connection to the conductor plate layer 52 to provide a second connection for the capacitor formed by layers 52, 54 and 58.

A via portion 72 in metallization level 30 connects the conductive runner portion 68 to a conductive runner 74 in metallization level 20. The conductor runner 74 is connected through another via portion 72 to conductive runner portion 76 of level 30. A via portion 78 of level 40 connects the conductive runner portion 76 to the conductive runner 82 of level 40 to effect contact through the via portion 66 to the capacitor conductor 56. A via portion 94 (associated with an overlying level of metallization) provides connection of the plates 52 and 56 to other circuitry not illustrated. Alternately, this connection could be made to a lower level of metallization through the conductive runner 74 of level 20. A via portion 96 (also associated with an overlying level of metallization) provides connection of the common plate 54 through a conductive runner 98 of level 40 to other circuitry not illustrated.

Figure 2:
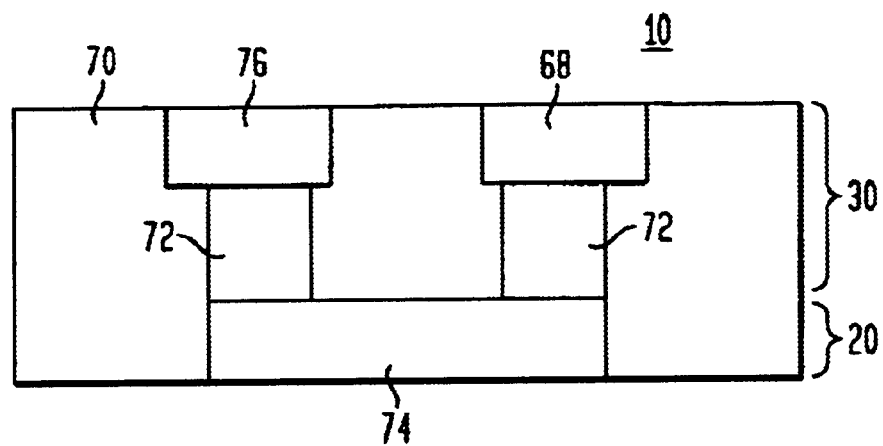
FIGS. 2–7 illustrate fabrication steps leading to formation of the FIG. 1 embodiment.

The Damascene structure within which the exemplary capacitor 50 is formed is well known and is only briefly described. Generally, for the exemplary embodiments, each level of metallization is formed with an initial deposit of a dielectric layer such as the layer 70 of FIG. 2. The levels 20/30 of metallization are completed prior to formation of the capacitor structure 50. The layer 70 of dielectric material will typically be multi-layered, formed with an etch stop such as silicon nitride and plannarized by chemical mechanical polishing (CMP). Desired configurations of the Cu conductor lines are patterned and etched in the dielectric material to form trench-like openings therein. Commonly, conductive barrier material (not illustrated) such as Ta, TaN or TiN is deposited along the surfaces of the etched opening to prevent migration of copper which is subsequently deposited in the openings. The barrier metal may be formed with chemical vapor deposition (CVD) or physical vapor deposition (PVD).

The Cu deposition is initiated with deposit of a seed layer on the barrier material, followed by electro-plating of Cu (e.g., from Copper sulfate) to fill the openings. For dual Damascene structures such as the illustrated levels 20/30 both the via portion (providing connection between different levels of metallization) and the conductor portion (providing conductor runners within a level of metallization) are formed in sequential pattern and etch steps, followed by deposit of the barrier layer material, a seed layer and then an electro-deposition of the Cu to completely fill the via portions and the conductor member portions of the openings. After Cu deposition, an anneal may be provided to stabilize the micro structure. The structure is polished to remove excess copper and barrier metal from the surface of the dielectric layer 70. This sequence is repeated for each level of metallization until the final copper layer of interconnection is passivated and the structure is prepared for packaging and assembly.

Figure 3:
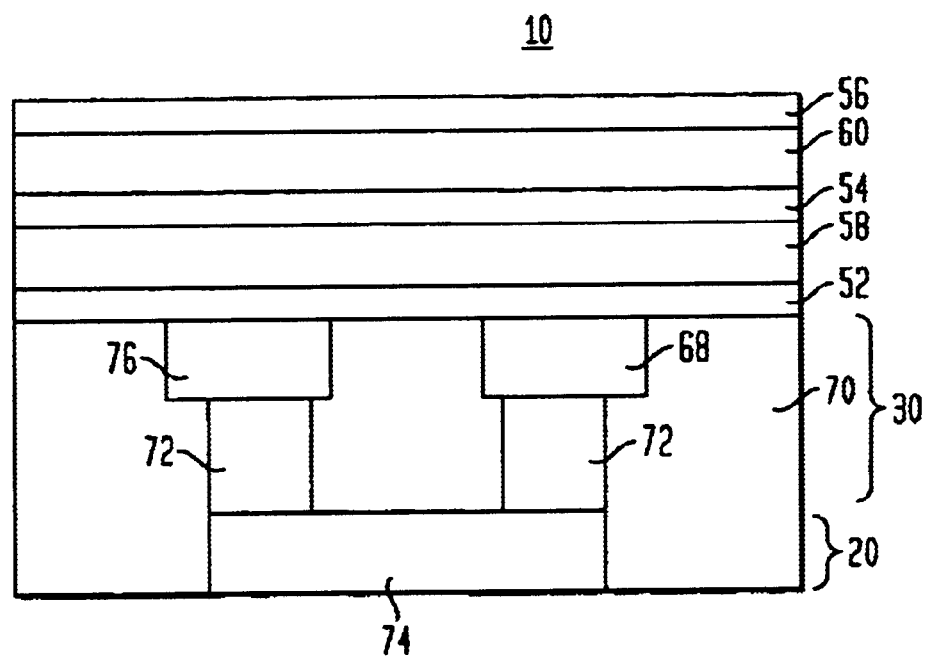

Once the dual Damascene levels 20/30 are completed the layers of conductor 52, 54, and 56 and intervening dielectric layers 58 and 60 are deposited. See FIG. 3. The conductor layers 52, 54, 56 may be formed of sputtered Ta or TaN or TiN. These layers may be deposited by physical vapor deposition (PVD) or chemical vapor deposition (CVD). Preferably, the conductor layer 52 will comprise a Ti/TiN or Ta/TaN stack to provide a diffusion barrier and assure suitable adhesion of the conductor layer 52 with the underlying dielectric layer 70. By way of example, a Ti/TiN stack having approximately 20 nm of Ti and approximately 40 nm of TiN, may be deposited by a sequential sputter at 400 C, followed by an anneal. The layers 54 and 56 may also be deposited by sputter techniques with the identified materials. However, a wide variety of other conductive materials are suitable. The dielectric layers 58 and 60 may be silicon oxides deposited by CVD. The oxide may be formed from silane. Alternately, the dielectric layers 58 and 60 may be formed of $TaO_5$. Other insulator materials may be chosen based on desired dielectric constants and requirements regarding minimum current leakage.

Figure 4:
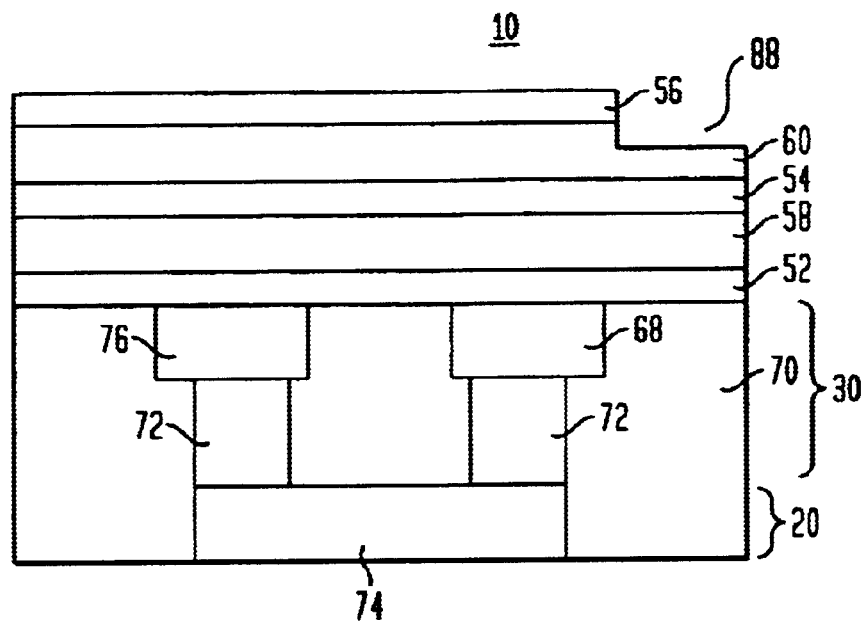
Figure 5:
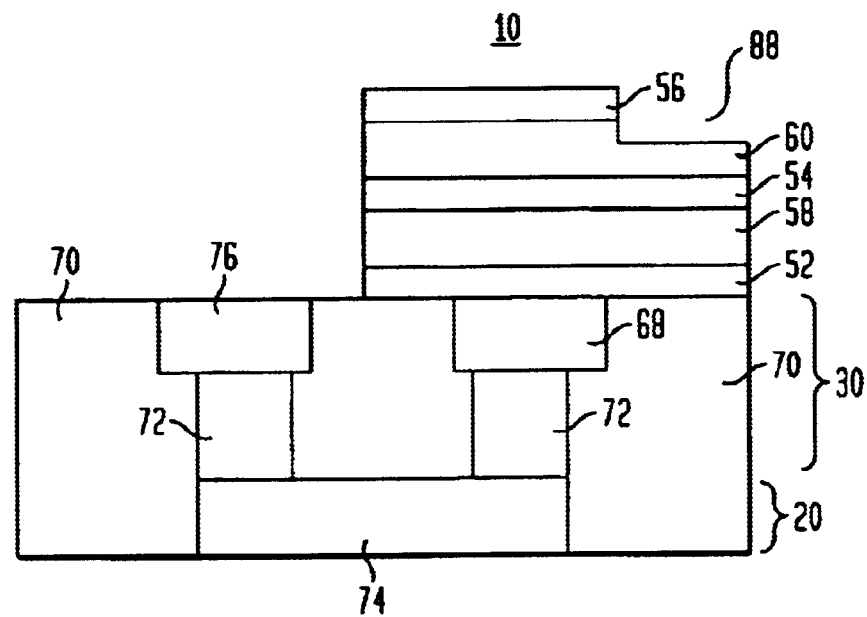

With reference to FIGS. 4 and 5, the upper most conductor layer 56 is patterned and etched to remove a portion thereof and begin formation of an opening 88 to provide electrical connection to the underlying layer 54. After the opening 88 is formed through the layer 56 for connection to the layer 54 all of the layers 52, 54, 56, 58 and 60 are patterned and etched in vertical alignment to fully define the capacitor structure 50. That is, the etch defines vertically aligned layers with respect to an underlying plane such as the plane 42 or the plane along the surface of the dielectric layer 70 on which the structure 50 is formed. See next FIG. 6, which illustrates a 60 nm barrier layer 80 of silicon nitride deposited on the exposed portions of layers 52, 54, 56, 58 and 60 as well as the dielectric layer 70 and exposed regions of Cu in the metallization level 30. See FIG. 5.

Figure 6:
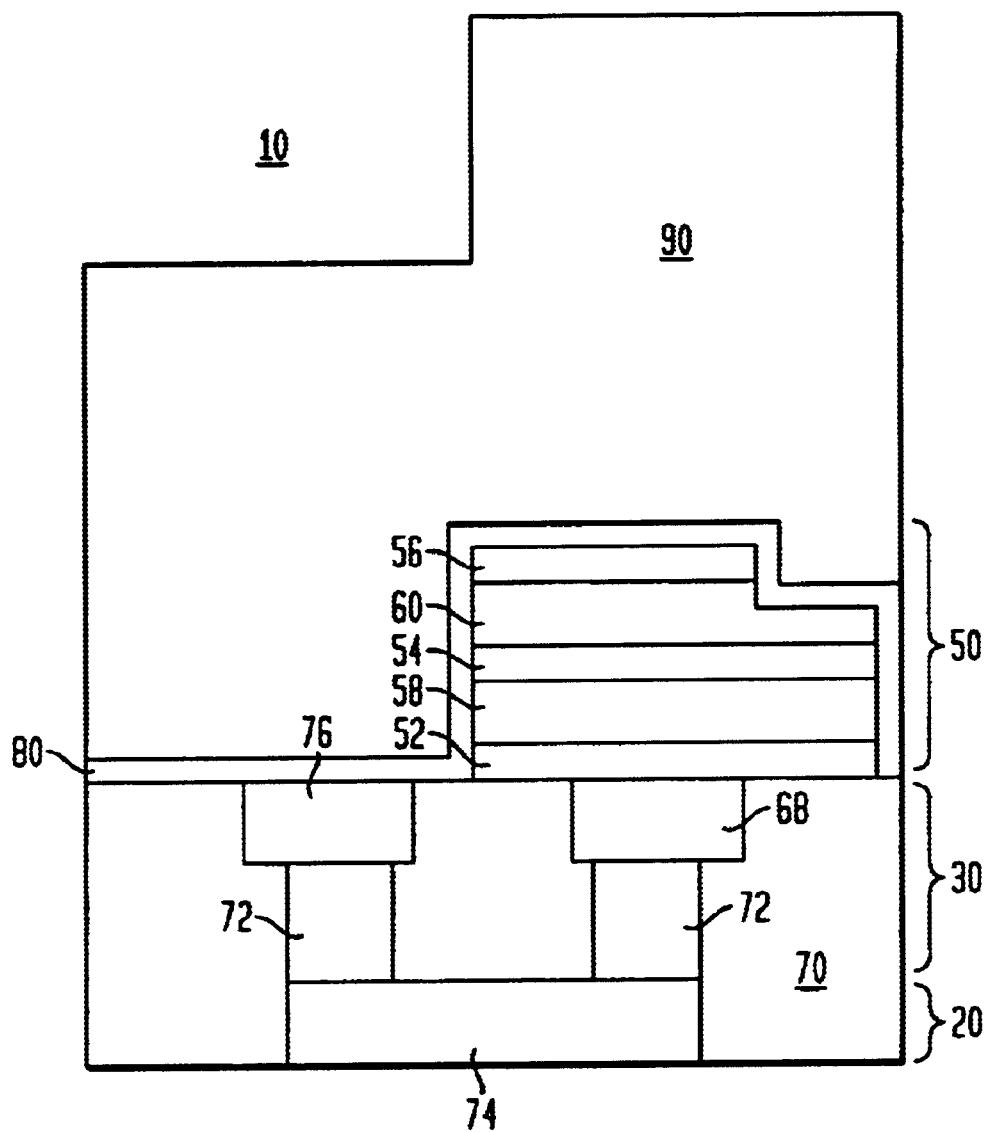
Figure 7:
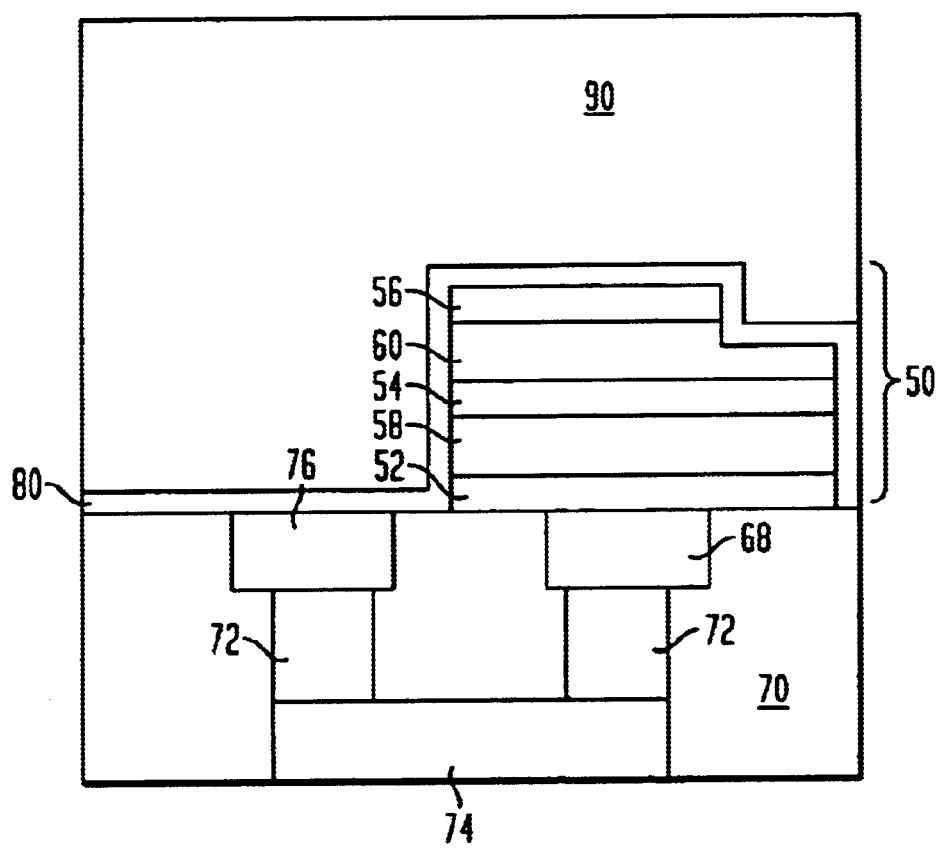

With reference to FIG. 6 another dielectric layer 90 is formed over the structure 10 by a conformal deposition such as high density plasma (HDP) deposition of silicon oxide. The dielectric layer 90 is planarized by CMP, or by metal topographic reduction (MTR), wherein deposit of photoresist over low regions is followed by a standard etch. The planarized structure, ready for formation of the metallization level 40, is illustrated in FIG. 7.

The via portions 64 and 66 and conductor members 82 and 98 of metallization level 40 are then formed in the dielectric layer 90 as illustrated in FIG. 1.

Figure 8:
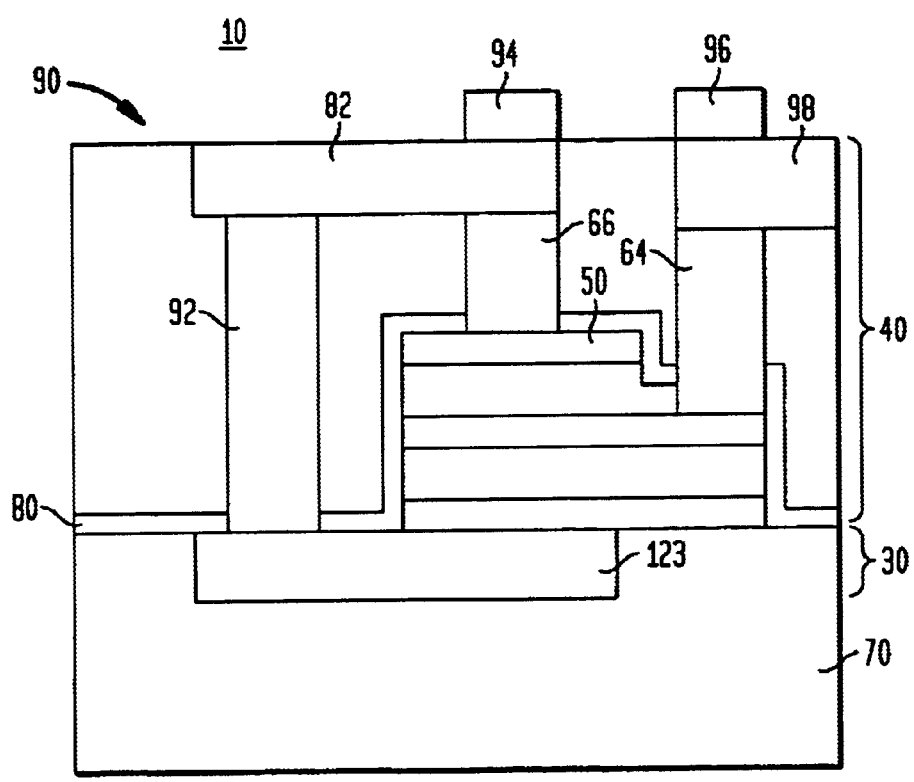
FIG. 8 illustrates an alternate preferred embodiment of the invention.

The capacitor structure 50 may also be connected in the circuit structure 10 with two levels of interconnect conductors as illustrated in FIG. 8. A lower conductor level 30 includes a runner portion 123 effecting connection between lower plate 52 and a via portion 92 of level 40. Other connections are as described with regard to FIG. 1.

Figure 9:
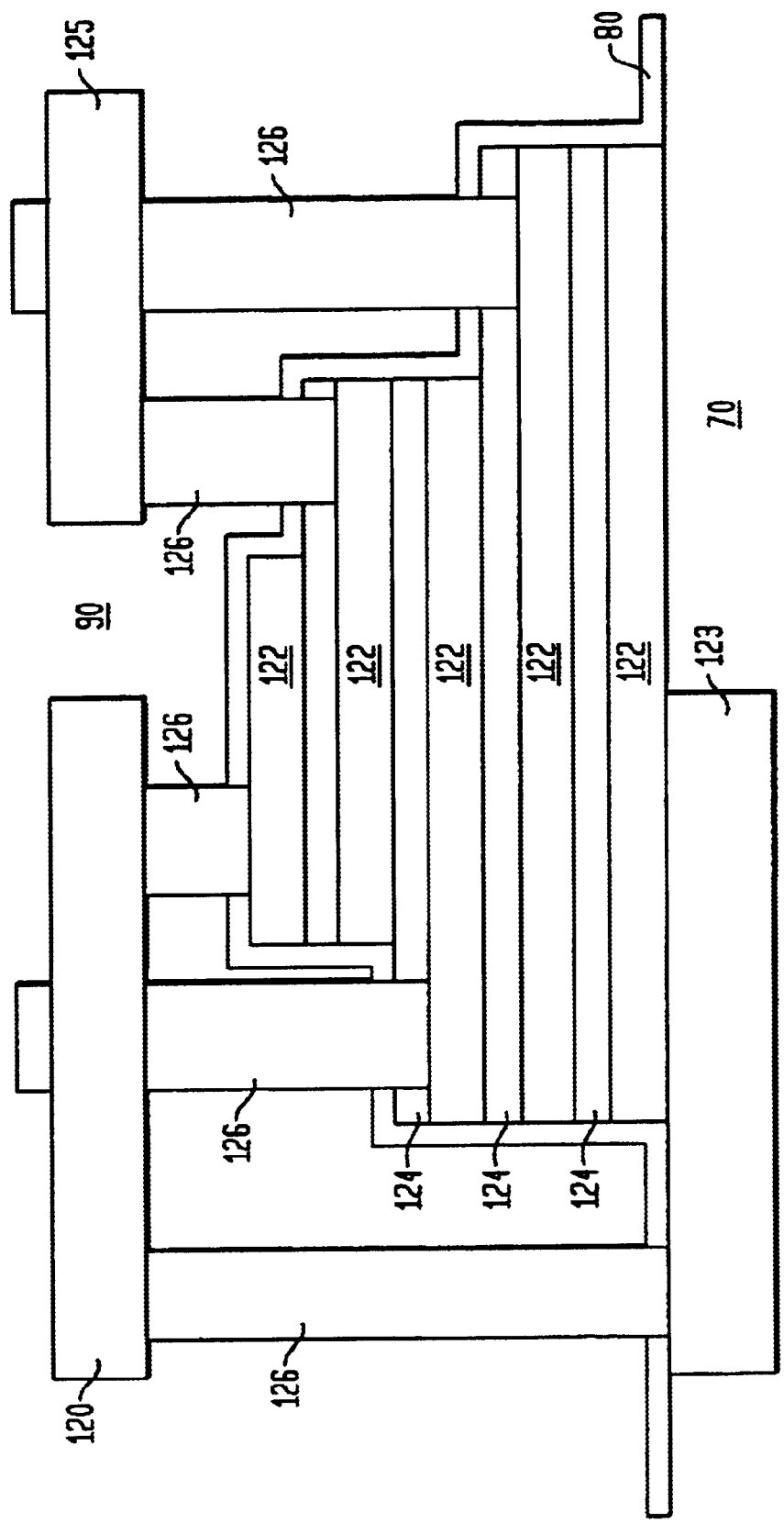
FIG. 9 illustrates another alternate embodiment of the invention.

In other embodiments of the invention stacks of three, four and more capacitors can be fabricated in parallel connection with such stacks formed between two levels of conductor. See FIG. 9 which illustrates a stack comprising five conductor layers 122 sequentially deposited with intervening dielectric layers 124 positioned between pairs of layers 120 to provide capacitor dielectrics. Connections to individual layers 122 are made through via portions 126 and conductive runners 120, 123 and 125 to configure four capacitors connected in parallel.

Figure 10:
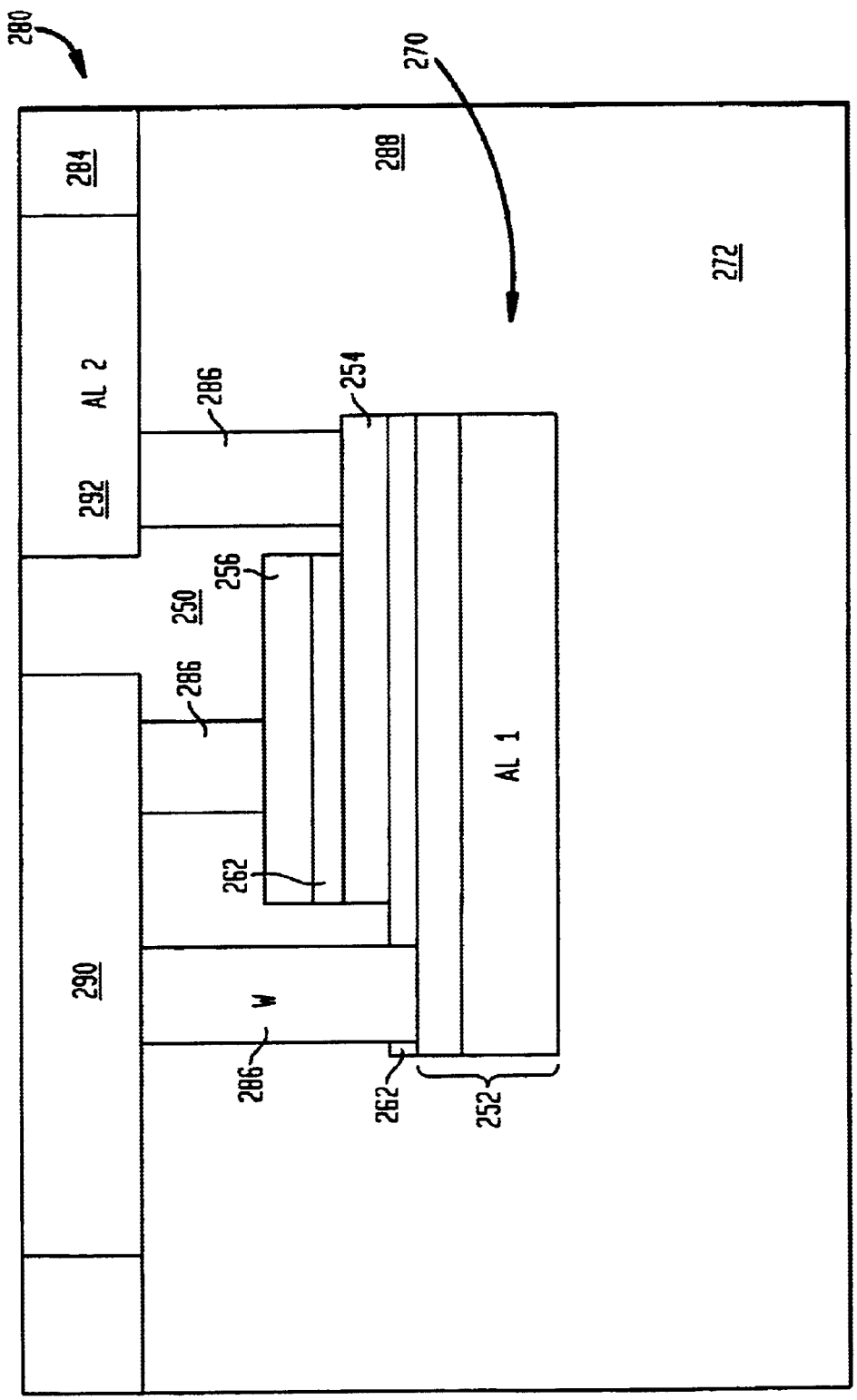
FIG. 10 illustrates still another alternate embodiment of the invention.

The principles shown in dual Damascene embodiments may also be readily applied to Al interconnect in a conventional subtractive metal etch process. See FIG. 10 which illustrates the capacitor structure 250 including three sequentially formed metal layers 252, 254, and 256 with two intervening dielectric layers 262 positioned between pairs (252, 254) and (254, 256) of layers to provide capacitor dielectric. The structure 250 is connected to configure two parallel capacitors. The lowest level 252 metal layer may be a runner in a level 270 of Al interconnect comprising Al—Cu alloy with an under-layer of Ti/TiN providing adhesion and a barrier against diffusion. The level 270 is formed over a dielectric layer 272. The layers 254 and 256 may be deposited TiN. A second level 280 of Al interconnect is formed above the structure 250 in a dielectric layer 284. Contacts 286 extend through an interlevel dielectric layer 288 to configure the parallel capacitors in connection with two runners 290 and 292 in level 280. Alternately, all of the layers of the capacitor structure 250 may be formed in vertical alignment, with the contact between runner 290 and layer 252 made through a connection to a metal runner below the level 270 (not illustrated).

An architecture has been described which is useful for high density formation of capacitor structures in integrated circuits. Application of the disclosed design and fabrication methods may be made to a variety of digital and analog circuit applications, including memory circuits which utilize capacitors and analog circuitry which demands large values of capacitance. The specific metal and insulator materials disclosed are exemplary, as are the specific interconnect patterns shown for configuring parallel capacitors. However, the principles disclosed herein provide a basis for practicing the invention in a variety of ways on a variety of circuit structures, including structures formed with other materials, such as compound structures. Numerous variations will be apparent to those skilled in the art. Thus, other constructions, although not expressly described herein do not depart from the scope of the invention which is only limited by the claims which follow.

We claim:

1. A monolithic integrated circuit comprising:
   at least first and second levels of interconnect conductor for connection to a semiconductor layer; and
   a stack of alternating conductive and insulative layers formed in vertical alignment with respect to an underlying plane and formed between the first and second levels of conductor, including
   a first conductive layer,
   a first insulator layer formed over the first conductive layer,
   a second conductive layer formed over the first insulative layer,
   a second insulator layer formed over the second conductive layer, and
   a third conductive layer formed over the second insulative layer,
   with the first and third conductive layer commonly connected.

2. The device of claim 1 wherein the first and third conductive layers are commonly connected through the first and second levels of interconnect conductor.

3. The device of claim 1 further including a third level of interconnect conductor with the first and second conductor layers commonly connected through the first, second and third levels of interconnect conductor.

4. The device of claim 1 wherein the conductors connecting the first and third conductive layers include via portions and trench portions of a Damascene structure.

5. The device of claim 1 wherein the stack of alternating conductive and insulative layers includes one or more pairs of additional conductive and insulative layers formed, over the third conductive layer providing an uppermost conductive layer commonly connected with the first and third conductive layers.

6. The device of claim 5 wherein the stack comprises 5 conductive layers configured to provide 4 capacitors connected in parallel.

* * * * *